US 9,679,528 B2

(12) United States Patent
Yu

(10) Patent No.: US 9,679,528 B2
(45) Date of Patent: Jun. 13, 2017

(54) SHIFT REGISTER UNIT, GATE DRIVING CIRCUIT AND DISPLAY DEVICE

(71) Applicant: Shenzhen China Star Optoelectronics Technology Co., Ltd., Shenzhen, Guangdong (CN)

(72) Inventor: Xiaojiang Yu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 222 days.

(21) Appl. No.: 14/414,100

(22) PCT Filed: Dec. 3, 2014

(86) PCT No.: PCT/CN2014/092886
§ 371 (c)(1),
(2) Date: Jan. 10, 2015

(87) PCT Pub. No.: WO2016/078141
PCT Pub. Date: May 26, 2016

(65) Prior Publication Data
US 2016/0358571 A1    Dec. 8, 2016

(30) Foreign Application Priority Data

Nov. 20, 2014   (CN) .......................... 2014 1 0669229

(51) Int. Cl.
*G06F 3/038*   (2013.01)
*G09G 5/00*    (2006.01)
(Continued)

(52) U.S. Cl.
CPC ......... *G09G 3/3677* (2013.01); *G09G 3/3696* (2013.01); *G11C 19/28* (2013.01);
(Continued)

(58) Field of Classification Search
None
See application file for complete search history.

(56) References Cited

U.S. PATENT DOCUMENTS

2010/0238143 A1* 9/2010 Liu .................... G09G 3/20
                                                    345/204
2011/0216877 A1* 9/2011 Hsu .................. G11C 19/00
                                                    377/79

(Continued)

*Primary Examiner* — Ilana Spar
*Assistant Examiner* — Kirk Hermann
(74) *Attorney, Agent, or Firm* — Andrew C. Cheng

(57) ABSTRACT

A shift register unit provides a gate voltage to a nth pixel of a liquid crystal display and includes first to third N-type transistors. Gates of the first and second N-type transistors respectively receive gate voltages of n-2th and n-2th pixels. First ends of the first and second N-type transistors respectively receive first and second input signals. Second ends of the first and second N-type transistors are coupled to a gate of the third N-type transistor The gate voltages of the n-2th and n-2th pixels respectively control conduction of the first and second N-type transistors so as to allow the first and second input signals to selectively conduct on the third N-type transistor. A first end of the third N-type transistor is coupled to a first or second clock signal, and a second end is a voltage output end coupled to the nth pixel.

15 Claims, 5 Drawing Sheets

(51) Int. Cl.
*G09G 3/36* (2006.01)
*G11C 19/28* (2006.01)
(52) U.S. Cl.
CPC . *G09G 2300/08* (2013.01); *G09G 2300/0842* (2013.01); *G09G 2310/0281* (2013.01); *G09G 2310/0286* (2013.01); *G09G 2310/08* (2013.01); *G09G 2330/021* (2013.01)

(56) References Cited

U.S. PATENT DOCUMENTS

2011/0234577 A1* 9/2011 Yang .................... G09G 3/3677
 345/212
2012/0008731 A1* 1/2012 Hsu ........................ G11C 19/28
 377/79

* cited by examiner

SHIFT REGISTER UNIT, GATE DRIVING CIRCUIT AND DISPLAY DEVICE

CROSS REFERENCE TO RELATED APPLICATIONS

This application claims the priority of Chinese Patent Application No. 201410669229.4, entitled "shift register unit, gate driving circuit and display device", filed on Nov. 20, 2014, the disclosure of which is incorporated herein by reference in its entirety.

FIELD OF THE INVENTION

The present invention relates to a display technology field, and more particularly to a shift register unit, a gate driving circuit and a display device.

BACKGROUND OF THE INVENTION

Present, the flat displays are new technology which has been rapidly developed in recent years. The application field has been exploded more widely because the flat display possesses many advantages. The advantages mainly can be: portability, low voltage, no X radiation, no flashing jitter, no static generation, low power consumption; meanwhile, the lifetime of the most displays is longer than those of CRTs. The positive electrodes of the flat panel display can be simpler. The liquid crystal display can be illustrated. The scanning to the screen line by line is generally utilized when the liquid crystal display shows images. The on and off of the thin film transistor of the sub pixel in each line is controlled by one gate scan line. The gate driving circuit structure of the pixel set employed for driving the liquid crystal display is complex which leads to bigger frames of the liquid crystal display and the power consumption is higher.

SUMMARY OF THE INVENTION

An objective of the present invention is to provide a shift register unit, a gate driving circuit and a liquid crystal display to diminish the frame of liquid crystal display.

For realizing the aforesaid objective, the technical solution provided by the embodiments of the present invention is:

The present invention provides a shift register unit, employed for providing a gate voltage to a nth pixel of a liquid crystal display, wherein the shift register unit comprises a first N-type transistor, a second N-type transistor, and a third N-type transistor, wherein, a gate of the first N-type transistor receives a gate voltage of a n-2th pixel, and a first end of the first N-type transistor receives a first input signal, and a second end of the first N-type transistor is coupled to a gate of the third N-type transistor; wherein the gate voltage of the n-2th pixel is employed to control on-off of the first N-type transistor, and to control on-off of the first input signal to the third N-type transistor; wherein n is a natural number larger than 2;

a gate of the second N-type transistor receives a gate voltage of a n+2th pixel, and a first end of the second N-type transistor receives a second input signal, and a second end of the second N-type transistor is coupled to the gate of the third N-type transistor; wherein the gate voltage of the n+2th pixel is employed to control on-off of the second N-type transistor, and to control on-off of the second input signal to the third N-type transistor;

a first end of the third N-type transistor is coupled to a first or second clock signal, and a second end of the third N-type transistor is employed as being a voltage output end of the shift register unit to be coupled to the nth pixel for charging and discharging the nth pixel, and to provide a gate voltage.

The shift register unit further comprises a first capacitor, and the first capacitor is coupled between the gate of the third N-type transistor and the second end of the third N-type transistor.

The shift register unit further comprises a fourth N-type transistor, and a gate of the fourth N-type transistor receives the first or second clock signal, and a first end of the fourth N-type transistor is coupled to the gate of the third N-type transistor, and a second end of the fourth N-type transistor is coupled to a second end of the third N-type transistor, and the gate of the fourth N-type transistor and the first end of the third N-type transistor receive the same clock signal.

The shift register unit further comprises a fifth N-type transistor, and a first end of the fifth N-type transistor is coupled to the second end of the third N-type transistor, and a second end of the fifth N-type transistor is coupled to a direct current low voltage source, and a gate of the fifth N-type transistor receives a pull-down control signal to be in an off state as the third N-type transistor is on.

The shift register unit further comprises a sixth N-type transistor, a seventh N-type transistor, an eighth N-type transistor and a second capacitor, and a gate of the sixth N-type transistor is coupled to a first end of the sixth N-type transistor, and the first end of the sixth N-type transistor receives the first clock signal or the second clock signal, and a second end of the sixth N-type transistor is coupled to a first end of the second capacitor and the gate of the fifth N-type transistor to output the pull-down control signal to the gate of the fifth N-type transistor, and a second end of the second capacitor is coupled to the second end of the fifth N-type transistor, and a gate of the seventh N-type transistor is coupled to the second end of the first, the second N-type transistors, and a first end of the seventh N-type transistor is coupled to the second end of the sixth N-type transistor, and a second end of the seventh N-type transistor is coupled to a direct current low voltage source or the second or first clock signal, and a gate of the eighth N-type transistor is coupled to a gate receiving reset signal, and a first end of the eighth N-type transistor is coupled to the gate of the seventh N-type transistor, and a second end of the eighth N-type transistor is coupled to the second end of the fifth N-type transistor, wherein the first end of the third N-type transistor and the first end of the sixth N-type transistor receive different clock signals. The first end of the sixth N-type transistor and the second end of the seventh N-type transistor receive the same clock signal.

The shift register unit further comprises a ninth N-type transistor, and a first end of the ninth N-type transistor is coupled to the gate of the third N-type transistor, and a second end of the ninth N-type transistor is coupled to the first end of the fourth N-type transistor, and a gate of the ninth N-type transistor is coupled to the second end of the sixth N-type transistor, employed to receive the pull-down control signal to control the fifth N-type transistor to be in an off state when the third N-type transistor is on.

The present invention further provides a gate driving circuit, employed for providing a gate voltage to a pixel set of a liquid crystal display, wherein the gate driving circuit comprises a first set of shift register units and a second set of shift register units, and the first set of shift register units are located at one side of the pixel set to provide the gate voltage to pixels in odd lines of the pixel set, and the second set of shift register units are located at the other side of the pixel set to provide the gate voltage to pixels in even lines of the pixel set, wherein each shift register unit of the first, the second set of shift register units comprises a first N-type transistor, a second N-type transistor, and a third N-type transistor, and one shift register unit corresponds to pixels in one line;

except for shift register units of first lines in the first and the second sets of shift register units, a gate of the first N-type transistor in each of the rest shift register units is coupled to a voltage output end of a former level shift register unit of the corresponding set, and a first end of the first N-type transistor receives a first input signal, and a second end of the first N-type transistor is coupled to a gate of the third N-type transistor of the corresponding set; wherein the voltage output end of the former level shift register unit of the corresponding set is employed to control on-off of the corresponding first N-type transistor, and to control on-off of the first input signal to the corresponding third N-type transistor;

except for shift register units of last lines in the first and the second sets of shift register units, a gate of the second N-type transistor in each of the rest shift register units is coupled to a voltage output end of a latter level shift register unit of the corresponding set, and a first end of the second N-type transistor receives a second input signal, and a second end of the second N-type transistor is coupled to the gate of the third N-type transistor of the corresponding set; wherein the voltage output end of the latter level shift register unit of the corresponding set is employed to control on-off of the corresponding second N-type transistor, and to control on-off of the second input signal to the corresponding third N-type transistor;

a first end of the third N-type transistor in each rest shift register unit is coupled to a first clock signal or a second clock signal, and a second end of the third N-type transistor is employed as being a voltage output end of the corresponding shift register unit to be coupled to the pixels of the corresponding line for charging and discharging the pixels, and to provide a gate voltage.

Both the first set of shift register units and the second set of shift register units are located on a glass substrate of the liquid crystal display.

Each shift register unit further comprises a first capacitor, and the first capacitor is coupled between the gate of the third N-type transistor and the second end of the third N-type transistor of the corresponding shift register unit.

Each shift register unit further comprises a fourth N-type transistor, and a gate of the fourth N-type transistor receives the first or second clock signal, and a first end of the fourth N-type transistor is coupled to the gate of the corresponding third N-type transistor, and a second end of the fourth N-type transistor is coupled to a second end of the corresponding third N-type transistor, wherein the gate of the fourth N-type transistor and the first end of the corresponding third N-type transistor receive the same clock signal.

The present invention further provides a liquid crystal display, comprising a pixel set and a gate driving circuit, wherein the gate driving circuit comprises a first set of shift register units and a second set of shift register units, and the first set of shift register units are located at one side of the pixel set to provide the gate voltage to pixels in odd lines of the pixel set, and the second set of shift register units are located at the other side of the pixel set to provide the gate voltage to pixels in even lines of the pixel set, wherein each shift register unit of the first, the second set of shift register units comprises a first N-type transistor, a second N-type transistor, and a third N-type transistor, and one shift register unit corresponds to pixels in one line;

except for shift register units of first lines in the first and the second sets of shift register units, a gate of the first N-type transistor in each of the rest shift register units is coupled to a voltage output end of a former level shift register unit of the corresponding set, and a first end of the first N-type transistor receives a first input signal, and a second end of the first N-type transistor is coupled to a gate of the third N-type transistor of the corresponding set; wherein the voltage output end of the former level shift register unit of the corresponding set is employed to control on-off of the corresponding first N-type transistor, and to control on-off of the first input signal to the corresponding third N-type transistor except for shift register units of last lines in the first and the second sets of shift register units, a gate of the second N-type transistor in each of the rest shift register units is coupled to a voltage output end of a latter level shift register unit of the corresponding set, and a first end of the second N-type transistor receives a second input signal, and a second end of the second N-type transistor is coupled to the gate of the third N-type transistor of the corresponding set; wherein the voltage output end of the latter level shift register unit of the corresponding set is employed to control on-off of the corresponding second N-type transistor, and to control on-off of the second input signal to the corresponding third N-type transistor;

a first end of the third N-type transistor in each rest shift register unit is coupled to a first clock signal or a second clock signal, and a second end of the third N-type transistor is employed as being a voltage output end of the corresponding shift register unit, and employed to be coupled to the pixels of the corresponding line for charging and discharging the pixels, and to provide a gate voltage.

Each shift register unit further comprises a first capacitor, and the first capacitor is coupled between the gate of the corresponding third N-type transistor and the second end of the corresponding third N-type transistor.

Each shift register unit further comprises a fourth N-type transistor, and a gate of the fourth N-type transistor receives the first or second clock signal, and a first end of the fourth N-type transistor is coupled to the gate of the corresponding third N-type transistor, and a second end of the fourth N-type transistor is coupled to a second end of the corresponding third N-type transistor, and the gate of the fourth N-type transistor and the first end of the corresponding third N-type transistor receive the same clock signal.

Each shift register unit further comprises a fifth N-type transistor, and a first end of the fifth N-type transistor is coupled to the second end of the corresponding third N-type transistor, and a second end of the fifth N-type transistor is coupled to a direct current low voltage source, and a gate of the fifth N-type transistor receives a pull-up control signal to be in an off state as the corresponding transistor receives a pull-down control signal to be in an off state as the corresponding third N-type transistor is on.

Each shift register unit further comprises a sixth N-type transistor, a seventh N-type transistor, an eighth N-type transistor and a second capacitor, and a gate of the sixth N-type transistor is coupled to a first end of the sixth N-type transistor, and the first end of the sixth N-type transistor receives the first clock signal or the second clock signal, and a second end of the sixth N-type transistor is coupled to a first end of the corresponding second capacitor and the gate of the corresponding fifth N-type transistor to output the pull-down control signal to the gate of the corresponding fifth N-type transistor, and a second end of the second capacitor is coupled to the second end of the corresponding fifth N-type transistor, and a gate of the seventh N-type transistor is coupled to the second end of the corresponding first, the corresponding second N-type transistors, and a first end of the seventh N-type transistor is coupled to the second end of the corresponding sixth N-type transistor, and a second end of the seventh N-type transistor is coupled to a direct current low voltage source or the second or first clock signal, and a gate of the eighth N-type transistor receives a reset signal, and a first end of the eighth N-type transistor is coupled to the gate of the corresponding seventh N-type transistor, and a second end of the eighth N-type transistor is coupled to the second end of the corresponding fifth N-type transistor, wherein the first end of the third N-type transistor and the first end of the corresponding sixth N-type transistor receive different clock signals. The first end of the sixth N-type transistor and the second end of the corresponding seventh N-type transistor receive the same clock signal.

Each shift register unit further comprises a ninth N-type transistor, and a first end of the ninth N-type transistor is coupled to the gate of the corresponding third N-type transistor, and a second end of the ninth N-type transistor is coupled to the first end of the corresponding fourth N-type transistor, and a gate of the ninth N-type transistor is coupled to the second end of the corresponding sixth N-type transistor, employed to receive the pull-down control signal to control the corresponding fifth N-type transistor to be in an off state when the corresponding third N-type transistor is on.

The liquid crystal display further comprises a glass substrate, and the both the first set of shift register units and the second set of shift register units are located on the glass substrate.

Each shift register unit further comprises a first capacitor, and the first capacitor is coupled between the gate of the corresponding third N-type transistor and the second end of the third N-type transistor.

The shift register unit of the present invention comprises a first N-type transistor, a second N-type transistor, and a third N-type transistor; a gate of the first N-type transistor receives a gate voltage of a n-2th pixel, and a first end of the first N-type transistor receives a first input signal, and a second end of the first N-type transistor is coupled to a gate of the third N-type transistor; wherein the gate voltage of the n-2th pixel is employed to control on-off of the first N-type transistor, and to control on-off of the first input signal to the third N-type transistor, where n is a natural number larger than 2. A gate of the second N-type transistor receives a gate voltage of a n+2th pixel, and a first end of the second N-type transistor receives a second input signal, and a second end of the second N-type transistor is coupled to the gate of the third N-type transistor. The gate voltage of the n+2th pixel is employed to control on-off of the second N-type transistor, and to control on-off of the second input signal to the third N-type transistor. A first end of the third N-type transistor is coupled to a first or second clock signal, and a second end of the third N-type transistor is employed as being a voltage output end of the shift register unit to be coupled to the nth pixel for charging and discharging the nth pixel, and to provide a gate voltage. Therefore, the shift register unit is capable of steadily providing the gate voltage to the nth pixel of the liquid crystal display. The structure is simple and capable of diminishing the dimension of the frame of liquid crystal display. Besides, what the shift register unit has is a single level structure, which will not continuously output large current during the operation process and the power consumption is lower.

BRIEF DESCRIPTION OF THE DRAWINGS

In order to more clearly illustrate the embodiments of the present invention, the following figures will be described in the embodiments are briefly introduced. It is obvious that the drawings are only some embodiments of the present invention, those of ordinary skill in this field can obtain other figures according to these figures without paying the premise.

DETAILED DESCRIPTION OF PREFERRED EMBODIMENTS

For better explaining the technical solution and the effect of the present invention, the present invention will be further described in detail with the accompanying drawings in the specific embodiments.

Figure 1:
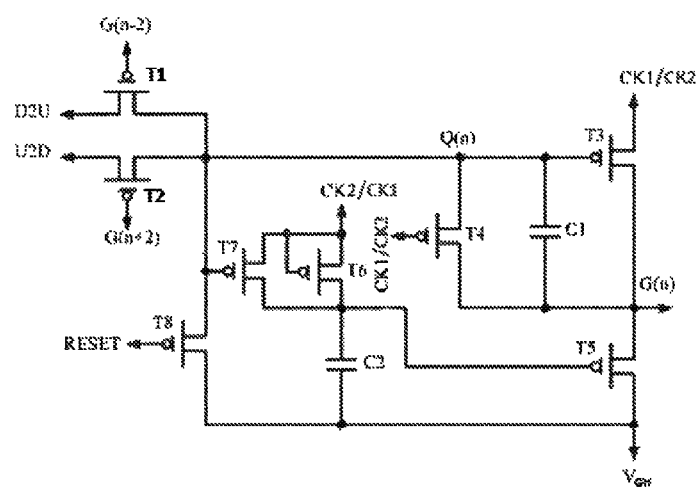
FIG. 1 is a circuit diagram of a shift register unit provided by the first embodiment of the first solution according to the present invention.

Please refer to FIG. 1, a shift register unit 100 provided by the first embodiment of the first solution according to the present invention.

The shift register unit 100 is employed for providing a gate voltage to a nth pixel of a liquid crystal display. The shift register unit 100 comprises a first N-type transistor T1, a second N-type transistor T2, a third N-type transistor T3 and a first capacitor C1. A gate of the first N-type transistor T1 receives a gate voltage of a n-2th pixel, and a first end of the first N-type transistor T1 receives a first input signal D2U, and a second end of the first N-type transistor T1 is coupled to a gate of the third N-type transistor T3. The gate voltage of the n-2th pixel is employed to control on-off of the first N-type transistor T1, and to control on-off of the first input signal D2U to the third N-type transistor T3. n is a natural number larger than 2.

A gate of the second N-type transistor T2 receives a gate voltage of a n+2th pixel, and a first end of the second N-type transistor T2 receives a second input signal U2D, and a second end of the second N-type transistor T2 is coupled to the gate of the third N-type transistor T3; wherein the gate voltage of the n+2th pixel is employed to control on-off of the second N-type transistor T2, and to control on-off of the second input signal U2D to the third N-type transistor T3.

Specifically, the shift register unit 100 is the nth shift register unit. The gate voltage of the n−2th pixel received by the first N-type transistor T1 of the nth shift register unit is obtained via the voltage output end G(n−2) of the n−2th shift register unit. The gate voltage of the n+2th pixel received by the second N-type transistor T2 of the nth shift register unit is obtained via the voltage output end G(n+2) of the n+2th shift register unit.

A first end of the third N-type transistor T3 is coupled to a first clock signal CK1 or a second clock signal CK2, and a second end of the third N-type transistor T3 is employed as being a voltage output end G(n) of the shift register unit 100 to be coupled to the nth pixel for charging and discharging the nth pixel, and to provide a gate voltage for the nth pixel.

In this embodiment, the voltage phases of the first input signal D2U and the second input signal U2D are opposite. Thus, the second input signal U2D is a low voltage level signal when the first input signal D2U is a high voltage level signal. The second input signal U2D is a high voltage level signal when the first input signal D2U is a low voltage level signal. The first N-type transistor T1, the second N-type transistor T2 and the third N-type transistor T3 are NMOS (N-Mental-Oxide-Semiconductor) thin film transistors. The sources and the drains of the first to third N-type transistors T1-T3 are symmetric. Therefore, no distinctions between the sources and the drains. Accordingly, the first ends and the seconds of the first to third N-type transistors T1-T3 can be sources and drains, or can be drains and sources.

In other embodiments, the first to third N-type transistors T1-T3 can be field effect transistors or other elements with similar properties.

Specifically, a node between the gate of the third N-type transistor T3 and the first, second N-type transistor T1 and T2 is defined as Q(n).

Furthermore, the first capacitor C1 is coupled between the gate of the third N-type transistor T3 and the second end of the third N-type transistor T3.

The first input signal D2U is at high voltage level and the second input signal U2D is at low voltage level when the gate scan of the liquid crystal display is from bottom to top. When the gate voltage of the n−2th pixel is at high voltage level, the first N-type transistor T1 is on for transmitting the first input signal D2U to the gate of the third N-type transistor T3. The third N-type transistor T3 is on. The first clock signal CK1 or the second clock signal CK2 is to charge or discharge the nth pixel via the voltage output end G(n) to provide the gate voltage. The boost effect of the first capacitor C1 is employed to adjust the voltage level of the node Q(n) to reduce the time delay of the gate voltage outputted from the voltage output end G(n) of the shift register unit 100 and to promote the output steadiness of the shift register unit 100, accordingly.

When the gate voltage of the n+2th pixel is at high voltage level, the second N-type transistor T2 is on for transmitting the second input signal U2D to the gate of the third N-type transistor T3. The third N-type transistor T3 is off. The first clock signal CK1 or the second clock signal CK2 no longer influences the voltage level of the voltage output end G(n) of the shift register unit 100.

Similarly, the first input signal D2U is at low voltage level and the second input signal U2D is at high voltage level when the gate scan of the liquid crystal display is from top to bottom. When the gate voltage of the n+2th pixel is at high voltage level, the second N-type transistor T2 is on for transmitting the second input signal U2D to the gate of the third N-type transistor T3. The third N-type transistor T3 is on. The first clock signal CK1 or the second clock signal CK2 is to charge or discharge the nth pixel via the voltage output end G(n) to provide the gate voltage. The boost effect of the first capacitor C1 is employed to adjust the voltage level of the node Q(n) to reduce the time delay of the gate voltage outputted from the voltage output end G(n) of the shift register unit 100 and to promote the output steadiness of the shift register unit 100, accordingly.

When the gate voltage of the n−2th pixel is at high voltage level, the first N-type transistor T1 is on for transmitting the first input signal D2U to the gate of the third N-type transistor T3. The third N-type transistor T3 is off. The first clock signal CK1 or the second clock signal CK2 no longer influences the voltage level of the voltage output end G(n) of the shift register unit 100.

In this embodiment, the shift register unit 100 comprises a first N-type transistor T1, a second N-type transistor T2, a third N-type transistor T3 and a first capacitor C1. A gate of the first N-type transistor T1 receives a gate voltage of a n-2th pixel, and a first end of the first N-type transistor T1 receives a first input signal D2U, and a second end of the first N-type transistor T1 is coupled to a gate of the third N-type transistor T3. The gate voltage of the n-2th pixel is employed to control on-off of the first N-type transistor T1, and to control on-off of the first input signal D2U to the third N-type transistor T3. n is a natural number larger than 2. A gate of the second N-type transistor T2 receives a gate voltage of a n+2th pixel, and a first end of the second N-type transistor T2 receives a second input signal U2D, and a second end of the second N-type transistor T2 is coupled to the gate of the third N-type transistor T3. The gate voltage of the n+2th pixel is employed to control on-off of the second N-type transistor T2, and to control on-off of the second input signal U2D to the third N-type transistor T3. A first end of the third N-type transistor T3 is coupled to a first clock signal CK1 or a second clock signal CK2, and a second end of the third N-type transistor T3 is employed as being a voltage output end G(n) of the shift register unit 100 to be coupled to the nth pixel for charging and discharging the nth pixel, and to provide a gate voltage for the nth pixel. Therefore, the shift register unit 100 is capable of providing a steady gate voltage to the nth pixel of the liquid crystal display. The structure is simple and capable of diminishing the dimension of the frame of liquid crystal display. Besides, what the shift register unit 100 has is a single level structure, which will not continuously outputting large current during the operation process and the power consumption is lower.

Furthermore, the shift register unit 100 further a fourth N-type transistor T4, and a gate of the fourth N-type transistor T4 receives the first clock signal CK1 or the second clock signal CK2, N-N-and a second end of the fourth N-type transistor T4 is coupled to a second end of the corresponding third N-type transistor T3. The gate of the fourth N-type transistor T4 and the first end of the corresponding third N-type transistor T3 receive the same clock signal.

The fourth N-type transistor T4 is controlled by the first clock signal CK1 or the second clock signal CK2 to pull up the node Q(n) in the non-charging period to maintain the node Q(n) at high voltage level, and to maintain the output steadiness of the voltage output end G(n) of the shift register unit 100, accordingly.

Furthermore, the shift register unit 100 further comprises a fifth N-type transistor T5. The first end of the fifth N-type transistor T5 is coupled to the second end of the third N-type transistor T3. The second end of the fifth N-type transistor T5 is coupled to the direct current low voltage source VGL. The gate of the fifth N-type transistor T5 receives a pull-down control signal to be in an off state when the third N-type transistor is on.

Specifically, the pull-down control signal is employed to control the fifth N-type transistor T5 to be in an off state before charging a voltage input end of the nth pixel and as charging the voltage input end of the nth pixel, and to be on in other moment except the foregoing times for maintaining the voltage output end G(n) of the shift register unit 100 in a state of low voltage level.

Furthermore, the shift register unit 100 further comprises a sixth N-type transistor T6, a seventh N-type transistor T7, an eighth N-type transistor T8 and a second capacitor C2, and a gate of the sixth N-type transistor T6 is coupled to a first end of the sixth N-type transistor T6, and the first end of the sixth N-type transistor T6 receives the second clock signal CK2 or the first clock signal CK1, and a second end of the sixth N-type transistor T6 is coupled to a first end of the second capacitor C2 and the gate of the fifth N-type transistor T5 to output a pull-down control signal to the gate of the fifth N-type transistor T5, and a second end of the second capacitor C2 is coupled to the second end of the fifth N-type transistor T5, and a gate of the seventh N-type transistor T7 is coupled to the second end of the first, the second N-type transistors T1, T2, and a first end of the seventh N-type transistor T7 is coupled to the second end of the sixth N-type transistor T6, and a second end of the seventh N-type transistor T7 receives the direct current low voltage source VGL, and a gate of the eighth N-type transistor T8 is coupled to a gate receiving reset signal RESET, and a second end of the eighth N-type transistor T8 is coupled to the second end of the fifth N-type transistor T5. The first end of the third N-type transistor T3 and the first end of the sixth N-type transistor T6 receive different clock signals. The first end of the sixth N-type transistor T6 and the second end of the seventh N-type transistor T7 receive the same clock signal.

Specifically, the first end of the sixth N-type transistor T6 receives the second clock signal CK2 and the gate of the fourth N-type transistor T4 receives the first clock signal CK1 when the first end of the third N-type transistor receives the first clock signal CK1. The first end of the sixth N-type transistor T6 receives the first clock signal CK1 and the second end of the seventh N-type transistor T7 receives the first clock signal CK1 when the first end of the third N-type transistor T3 receives the second clock signal CK2. The sixth N-type transistor T6, the seventh N-type transistor T7, the eighth N-type transistor T8 and the second capacitor C2 construct a pull down control unit to output the pull-down control signal. A node P(n) between second end of the sixth N-type transistor T6 and the gate of the fifth N-type transistor T5 outputs the pull-down control signal to the gate of the fifth N-type transistor T5. The pull-down control signal outputted from the node P(n) is employed to control the fifth N-type transistor T5 to be off before charging a voltage input end of the nth pixel and as charging the voltage input end of the nth pixel, and to be on in other moment except the foregoing times for maintaining the voltage output end G(n) of the shift register unit 100 in an state of high voltage level. The gate of the eighth N-type transistor T8 receives the reset signal RESET. When the reset signal RESET is high voltage level, the eighth N-type transistor T8 is on to pull down the node Q(n) to at low voltage level, accordingly to off the third N-type transistor T3. Accordingly, the gate voltage outputted from the voltage output end G(n) of the shift register unit 100 will not be influenced by the first clock signal CK1 or the second clock signal CK2 to promote the output steadiness of the shift register unit 100.

Figure 2:
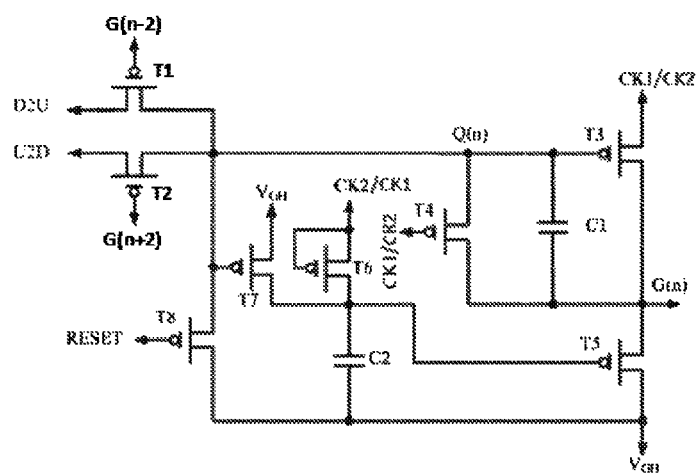
FIG. 2 is a circuit diagram of a shift register unit provided by the second embodiment of the first solution according to the present invention.

Please refer to FIG. 2, a shift register unit 200 provided by the second embodiment of the first solution according to the present invention. The shift register unit 200 provided by the second embodiment is similar with the shift register unit 100 provided by the first embodiment: in the second embodiment, the second end of the seventh P-type transistor T7 receives the second clock signal CK2 or the first clock signal CK1 to provide the second clock signal CK2 or the first clock signal CK1 to the node P(n) when the seventh P-type transistor T7 is on, and to control the fifth N-type transistor T5 to be off before charging a voltage output end G(n) of the shift register unit 100 and as charging the voltage output end G(n) of the shift register unit 100, and to be on in other moment except the foregoing times for maintaining the voltage output end G(n) of the shift register unit 100 in a state of low voltage level. The second end of the seventh P-type transistor T7 and the first end of the sixth N-type transistor T6 receive the same clock signal.

Furthermore, the shift register unit 200 further comprises a ninth N-type transistor T9, and a first end of the ninth N-type transistor T9 is coupled to the gate of the third N-type transistor T9, and a second end of the ninth N-type transistor T9 is coupled to the first end of the fourth N-type transistor T4, and a gate of the ninth N-type transistor T9 is coupled to the second end of the sixth N-type transistor T6, to be in an off state when the third N-type transistor T3 is on.

Specifically, the gate of the fourth N-type transistor T4 receives the first clock signal CK1 or the second clock signal CK, and the fourth N-type transistor T4 can be periodically on. Under the function of the pull-down control signal, the voltage output end G(n) of the shift register unit 100 is in a stage of non-charging, the ninth N-type transistor T9 maintains in an on state to be combined with the fourth N-type transistor T4 for maintaining the node Q(n) in the voltage output end G(n) of the shift register unit 100 in a state of low voltage level, accordingly to maintain the third N-type transistor T3 in an off state. Besides, the ninth N-type transistor T9 can be off before charging a voltage output end G(n) of the shift register unit 100 and as charging the voltage output end G(n) of the shift register unit 100 to diminish the leakage before charging the voltage output end G(n) of the shift register unit 100 and as charging the voltage output end G(n) of the shift register unit 100, and to provide the steadiness of the shift register unit 100, accordingly.

In this embodiment, the shift register unit 200 comprises a first N-type transistor T1, a second N-type transistor T2, a third N-type transistor T3 and a first capacitor C1. A gate of the first N-type transistor T1 receives a gate voltage of a n-2th pixel, and a first end of the first N-type transistor T1 receives a first input signal D2U, and a second end of the first N-type transistor T1 is coupled to a gate of the third N-type transistor T3. The gate voltage of the n-2th pixel is employed to control on-off of the first N-type transistor T1, and to control on-off of the first input signal D2U to the third N-type transistor T3. n is a natural number larger than 2. A gate of the second N-type transistor T2 receives a gate voltage of a n+2th pixel, and a first end of the second N-type transistor T2 receives a second input signal U2D, and a second end of the second N-type transistor T2 is coupled to the gate of the third N-type transistor T3. The gate voltage of the n+2th pixel is employed to control on-off of the second N-type transistor T2, and to control on-off of the second input signal U2D to the third N-type transistor T3. A first end of the third N-type transistor T3 is coupled to a first clock signal CK1 or a second clock signal CK2, and a second end of the third N-type transistor T3 is employed as being a voltage output end G(n) of the shift register unit 200 to be coupled to the nth pixel for charging and discharging the nth pixel, and to provide a gate voltage for the nth pixel. Therefore, the shift register unit 200 is capable of providing a steady gate voltage to the nth pixel of the liquid crystal display. The structure is simple and capable of diminishing the dimension of the frame of liquid crystal display. Besides, what the shift register unit 200 has is a single level structure, which will not continuously outputting large current during the operation process and the power consumption is lower.

Figure 3:
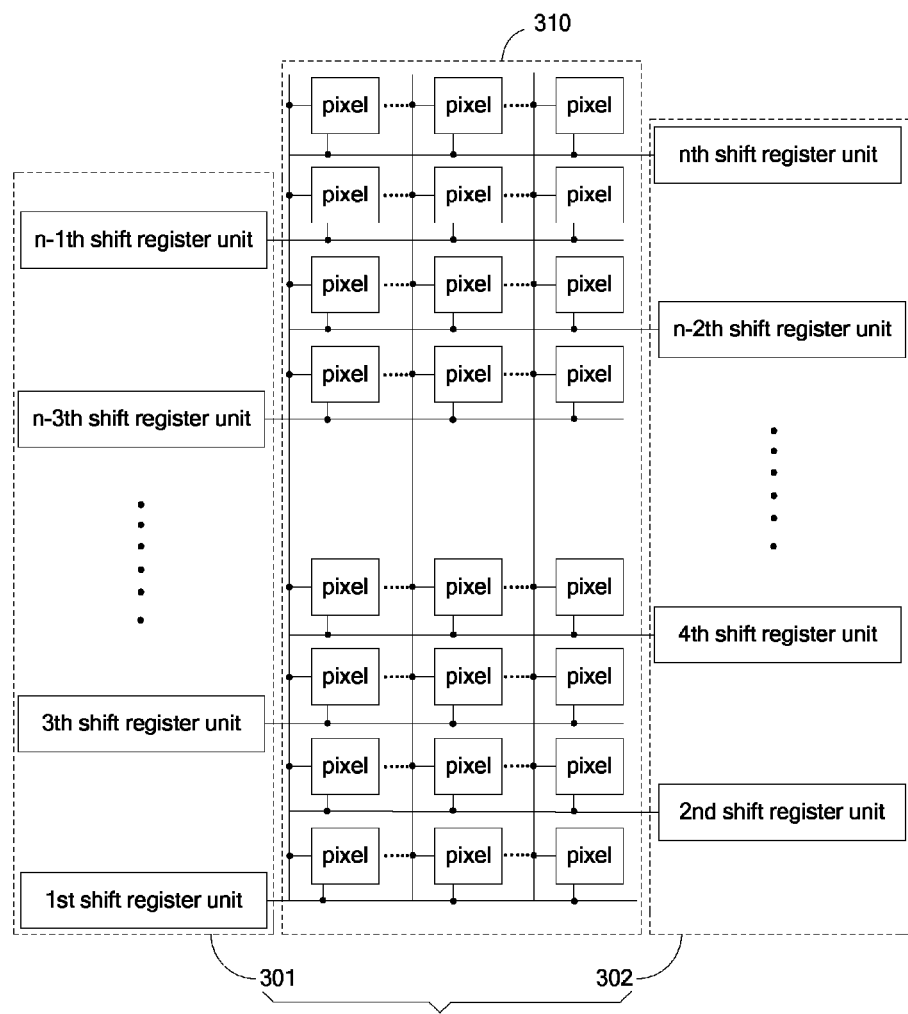
FIG. 3 is a application condition diagram of a gate driving circuit provided by the second solution according to the present invention.

Please refer to FIG. 3, a gate driving circuit 300 provided by the second solution according to the present invention. The gate driving circuit 300 is employed for providing a gate voltage to a pixel set 310 of a liquid crystal display. The gate driving circuit comprises a first set of shift register units 301 and a second set of shift register units 302. The first set of shift register units 301 are located at one side of the pixel set 310 to provide the gate voltage to pixels in odd lines of the pixel set 310, and the second set of shift register units 302 are located at the other side of the pixel set 310 to provide the gate voltage to pixels in even lines of the pixel set 310. The shift register units in the first set of shift register units 301 and the second set of shift register units 302 can be the shift register units 100 provided by the first embodiment of the first solution, or certainly can be the shift register units 200 provided by the second embodiment of the first solution. The structure and the function of the shift register unit 100 has already described in the aforesaid first solution in detail. The repeated description is omitted here.

Except shift register units 100 of first lines in the first, the second set of shift register units 301, 302, a gate of the first N-type transistor T1 in each of the rest shift register units 100 is coupled to a voltage output end of a former level shift register unit 100 of the corresponding set.

Except shift register units 100 of last lines in the first, the second set of shift register units 301, 302, a gate of the second N-type transistor T2 in each of the rest shift register units 100 is coupled to a voltage output end of a latter level shift register unit 100 of the corresponding set.

Specifically, the first set of shift register units 301 comprises shift register units 100 of odd levels, such as a first level shift register unit, a third level shift register unit, a fifth level shift register unit which respectively correspond to the first level pixel, the third level pixel, the fifth level pixel. Except the first level shift register units 100 of the first lines, the gate of the first N-type transistor T1 of the third level shift register unit is coupled to the voltage output end G(1) of the first level shift register unit 100; the gate of the second N-type transistor T2 of the third level shift register unit is coupled to the voltage output end G(5) of the fifth level shift register unit 100; the gate of the first N-type transistor T1 of the fifth level shift register unit is coupled to the voltage output end G(3) of the third level shift register unit 100; the gate of the second N-type transistor T2 of the fifth level shift register unit is coupled to the voltage output end G(7) of the seventh level shift register unit 100; and et cetera, no repeat is done here.

Specifically, the first set, second set of shift register units 301, 302 are located on the glass substrate of the liquid crystal display.

Figure 4:
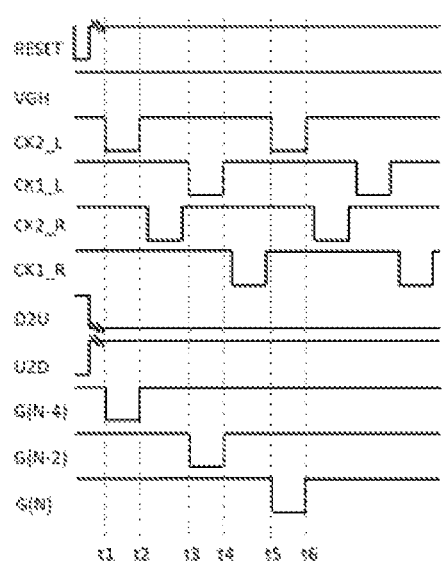
FIG. 4 is a scan sequence diagram of the shift register unit of the gate driving circuit shown in FIG. 3.

Please refer to FIG. 4 and the structure shown in FIG. 1 is illustrated below. All of the first to eighth N-type transistors T1-T8 in the shift register unit 100 are PMOS thin film transistors. With the accompanying scan sequence diagram of the shift register unit 100, the working procedure of the shift register unit 100 is described in detail.

Specifically, in the scan sequence diagram, the first input signal D2U is high voltage level, and the second input signal U2D is low voltage level. CK1_L and CK2_L are the first and second clock signals for driving the first set of shift register units 301. CK1_R and CK2_R are the first and second clock signals for driving the second set of shift register units 302. The reset signal RESET outputs high voltage level in the special periods (such as rebooting) to pull down the voltage level of the node Q(n). Now, the clock signals no longer influences the voltage level of the voltage output end G(n) of the shift register unit 100. The time period t1~t3 is the prepare time before the voltage output end G(n−2) of the n−2th shift register unit charges the n−2th pixel; the time period t3~t4 is the charging time when the voltage output end G(n−2) of the n−2th shift register unit charges the n−2th pixel. The specific procedure is:

At point t1, the voltage levels of second clock signal CK2_L and the voltage output end G(n−4) of the shift register unit start to ascend, and the first N-type transistor T1 of the n−2th shift register unit 100 is on. The voltage level of the node Q(n−2) is pulled to high voltage level. The third N-type transistor T3 is on, and the first clock signal CK1_L is low voltage level. The voltage output end G(n−2) of the n−2th shift register unit 100 is at low voltage level.

At point t2, the voltage levels of second clock signal CK2_L and the voltage output end G(n−4) of the shift register unit descend, and the first N-type transistor T1 of the n−2th shift register unit 100 is off and the voltage level of the node Q(n−2) is held to be high voltage level. The voltage level of the node P(n−2) is pulled down to low voltage level to make the fifth N-type transistor T5 with pull up function on. The voltage output end G(n−2) of the n−2th shift register unit 100 is at low voltage level.

At point t3, the voltage level of the first clock signal CK1_L ascends. The third N-type transistor T3 of the n−2th shift register unit 100 is on because the node Q(n−2) is at high voltage level. Accordingly, the voltage output end G(n−2) of the n−2th shift register unit 100 is pulled to high voltage level.

At point t4, the voltage level of the first clock signal CK1_L descends. The third N-type transistor T3 of the n−2th shift register unit 100 remains to be on because the node Q(n−2) is still at high voltage level. Accordingly, the voltage output end G(n−2) of the n−2th shift register unit 100 is pulled to low voltage level.

Similarly, the time period t3~t5 is the prepare time before the voltage output end G(n) of the nth shift register unit charges the nth pixel; the time period t5~t6 is the charging time when the voltage output end G(n) of the nth shift register unit charges the n−2th pixel.

Specifically, the respective level shift register unit charges and discharges the respective gate scan line of corresponding level pixel to make the display panel normally function.

In this embodiment, both the first set, second set of shift register units 301, 302 comprises shift register unit 100. Except the shift register units 100 of first lines in the first, the second set of shift register units 301, 302, the gate of the first N-type transistor T1 in each of the rest shift register units 100 is coupled to the voltage output end of the former level shift register unit 100 of the corresponding set. Except the shift register units 100, the gate of the second N-type transistor T2 in each of the rest shift register units 100 is coupled to the voltage output end of the latter level shift register unit 100 of the corresponding set. Besides, the structure of the gate driving circuit 300 is simple and capable of diminishing the dimension of the frame of liquid crystal display. What the shift register unit 100 has is a single level structure, which will not continuously outputting large current during the operation process and the power consumption is lower.

Figure 5:
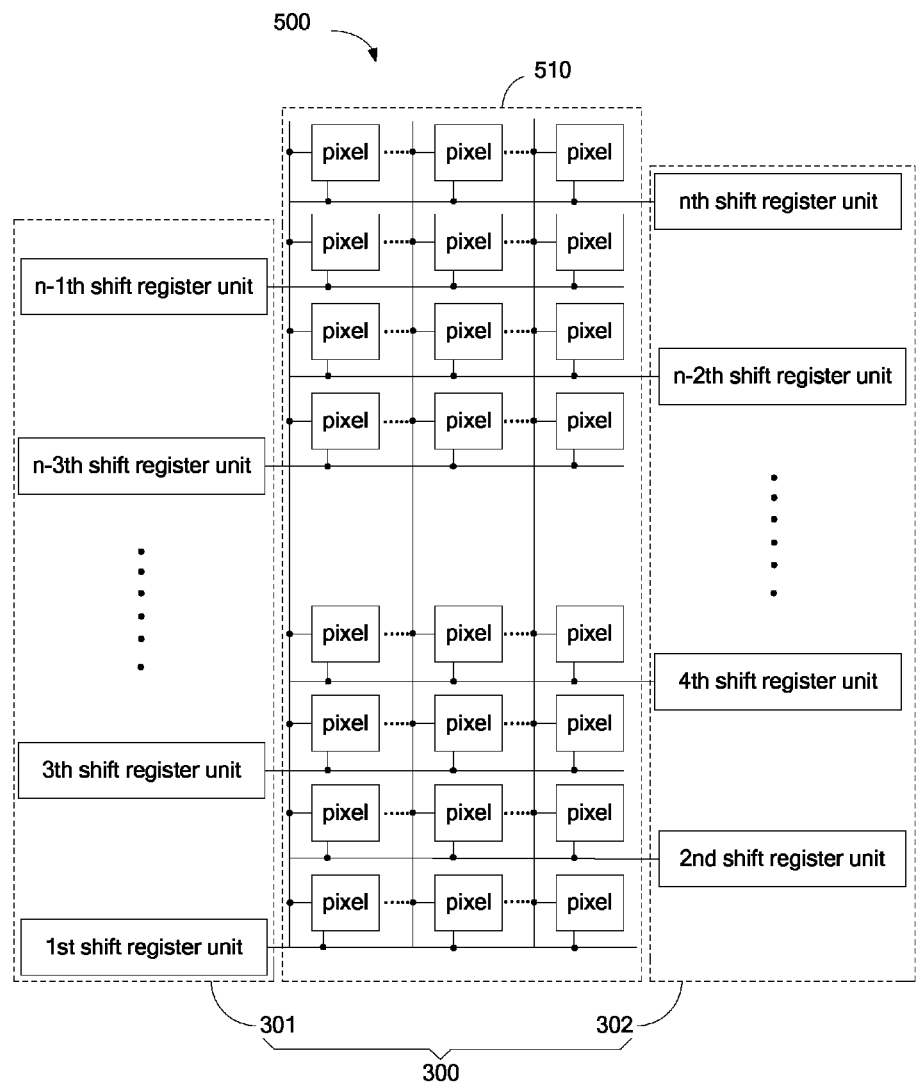
FIG. 5 is a diagram of a liquid crystal display provided by the embodiment of the third solution according to the present invention.

Please continue referring to FIG. 5, a liquid crystal display 500 provided by the embodiment of the third solution according to the present invention. The liquid crystal display comprises a pixel set 510 and a gate driving circuit. The gate driving circuit can be the gate driving circuit 300 provided by the aforesaid second solution. The gate driving circuit 300 has already described in the aforesaid second solution in detail. The repeated description is omitted here. The gate driving circuit is coupled to the pixel set for providing the gate voltage to the pixel set.

In this embodiment, both the first set, second set of shift register units 301, 302 comprises shift register unit 100. Except the shift register units 100 of first lines in the first, the second set of shift register units 301, 302, the gate of the first N-type transistor T1 in each of the rest shift register units 100 is coupled to the voltage output end of the former level shift register unit 100 of the corresponding set. Except the shift register units 100 of last lines, the gate of the second N-type transistor T2 in each of the rest shift register units 100 is coupled to the voltage output end of the latter level shift register unit 100 of the corresponding set. Besides, the structure of the gate driving circuit 300 is simple and capable of diminishing the dimension of the frame of liquid crystal display. What the shift register unit 100 has is a single level structure, which will not continuously outputting large current during the operation process and the power consumption of the liquid crystal display 500 is lower.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A shift register unit, employed for providing a gate voltage to a nth pixel of a liquid crystal display, wherein the shift register unit comprises a first N-type transistor, a second N-type transistor, and a third N-type transistor, wherein,
   a gate of the first N-type transistor receives a gate voltage of a n−2th pixel, and a first end of the first N-type transistor receives a first input signal, and a second end of the first N-type transistor is coupled to a gate of the third N-type transistor; wherein the gate voltage of the n−2th pixel is employed to control on-off of the first N-type transistor, and to control on-off of the first input signal to the third N-type transistor; wherein n is a natural number larger than 2;
   a gate of the second N-type transistor receives a gate voltage of a n−2th pixel, and a first end of the second N-type transistor receives a second input signal, and a second end of the second N-type transistor is coupled to the gate of the third N-type transistor; wherein the gate voltage of the n−2th pixel is employed to control on-off of the second N-type transistor, and to control on-off of the second input signal to the third N-type transistor;
   a first end of the third N-type transistor is coupled to a first or second clock signal, and a second end of the third N-type transistor is employed as being a voltage output end of the shift register unit to be coupled to the nth pixel for charging and discharging the nth pixel, and to provide a gate voltage;
   wherein the shift register unit further comprises a fourth N-type transistor, and a gate of the fourth N-type transistor receives the first or second clock signal, and a first end of the fourth N-type transistor is coupled to the gate of the third N-type transistor, and a second end of the fourth N-type transistor is coupled to a second end of the third N-type transistor, and the gate of the fourth N-type transistor and the first end of the third N-type transistor receive the same clock signal.

2. The shift register unit according to claim 1, wherein the shift register unit further comprises a first capacitor, and the first capacitor is coupled between the gate of the third N-type transistor and the second end of the third N-type transistor.

3. The shift register unit according to claim 1, wherein the shift register unit further comprises a fifth N-type transistor, and a first end of the fifth N-type transistor is coupled to the second end of the third N-type transistor, and a second end of the fifth N-type transistor is coupled to a direct current low voltage source, and a gate of the fifth N-type transistor receives a pull-down control signal to be in an off state as the third N-type transistor is on.

4. The shift register unit according to claim 3, wherein the shift register unit further comprises a sixth N-type transistor, a seventh N-type transistor, an eighth N-type transistor and a second capacitor, and a gate of the sixth N-type transistor is coupled to a first end of the sixth N-type transistor, and the first end of the sixth N-type transistor receives the first clock signal or the second clock signal, and a second end of the sixth N-type transistor is coupled to a first end of the second capacitor and the gate of the fifth N-type transistor to output the pull-down control signal to the gate of the fifth N-type transistor, and a second end of the second capacitor is coupled to the second end of the fifth N-type transistor, and a gate of the seventh N-type transistor is coupled to the second end of the first, the second N-type transistors, and a first end of the seventh N-type transistor is coupled to the gate of the sixth N-type transistor or the direct current low voltage source, and a second end of the seventh N-type transistor receives a direct current low voltage source or a second or first clock signal, and a gate of the eighth N-type transistor is coupled to a gate receiving reset signal, and a first end of the eighth N-type transistor is coupled to the gate of the seventh N-type transistor, and a second end of the eighth N-type transistor is coupled to the second end of the fifth N-type transistor, wherein the first end of the third N-type transistor and the first end of the sixth N-type transistor receive different clock signals, and the first end of the sixth N-type transistor and the second end of the seventh N-type transistor receive the same clock signal.

5. The shift register unit according to claim 4, wherein the shift register unit further comprises a ninth N-type transistor, and a first end of the ninth N-type transistor is coupled to the gate of the third N-type transistor, and a second end of the ninth N-type transistor is coupled to the first end of the fourth N-type transistor, and a gate of the ninth N-type transistor is coupled to the second end of the sixth N-type transistor, employed to receive the pull-down control signal to control the fifth N-type transistor to be in an off state when the third N-type transistor is on.

6. A gate driving circuit, employed for providing a gate voltage to a pixel set of a liquid crystal display, wherein the gate driving circuit comprises a first set of shift register units and a second set of shift register units, and the first set of shift register units are located at one side of the pixel set to provide the gate voltage to pixels in odd lines of the pixel set, and the second set of shift register units are located at the other side of the pixel set to provide the gate voltage to pixels in even lines of the pixel set, wherein each shift register unit of the first and the second set of shift register units comprises a first N-type transistor, a second N-type transistor, and a third N-type transistor, and one shift register unit corresponds to pixels in one line;
   except for shift register units of first lines in the first and the second sets of shift register units, a gate of the first N-type transistor in each of the rest shift register units is coupled to a voltage output end of a former level shift register unit of the corresponding set, and a first end of the first N-type transistor receives a first input signal, and a second end of the first N-type transistor is coupled to a gate of the third N-type transistor of the corresponding set; wherein the voltage output end of the former level shift register unit of the corresponding set is employed to control on-off of the corresponding first N-type transistor, and to control on-off of the first input signal to the corresponding third N-type transistor;

except for shift register units of last lines in the first and the second sets of shift register units, a gate of the second N-type transistor in each of the rest shift register units is coupled to a voltage output end of a latter level shift register unit of the corresponding set, and a first end of the second N-type transistor receives a second input signal, and a second end of the second N-type transistor is coupled to the gate of the third N-type transistor of the corresponding set; wherein the voltage output end of the latter level shift register unit of the corresponding set is employed to control on-off of the corresponding second N-type transistor, and to control on-off of the second input signal to the corresponding third N-type transistor;

a first end of the third N-type transistor in each rest shift register unit is coupled to a first clock signal or a second clock signal, and a second end of the third N-type transistor is employed as being a voltage output end of the corresponding shift register unit to be coupled to the pixels of the corresponding line for charging and discharging the pixels, and to provide a gate voltage;

wherein each of the shift register units of the first and the second set of shift register units further comprises a fourth N-type transistor, and a gate of the fourth N-type transistor receives the first or second clock signal, and a first end of the fourth N-type transistor is coupled to the gate of the third N-type transistor, and a second end of the fourth N-type transistor is coupled to a second end of the third N-type transistor, and the gate of the fourth N-type transistor and the first end of the third N-type transistor receive the same clock signal.

7. The gate driving circuit according to claim 6, wherein both the first set of shift register units and the second set of shift register units are located on a glass substrate of the liquid crystal display.

8. The gate driving circuit according to claim 6, wherein each shift register unit further comprises a first capacitor, and the first capacitor is coupled between the gate of the third N-type transistor and the second end of the third N-type transistor of the corresponding shift register unit.

9. A liquid crystal display, comprising a pixel set and a gate driving circuit, wherein the gate driving circuit comprises a first set of shift register units and a second set of shift register units, and the first set of shift register units are located at one side of the pixel set to provide the gate voltage to pixels in odd lines of the pixel set, and the second set of shift register units are located at the other side of the pixel set to provide the gate voltage to pixels in even lines of the pixel set, wherein each shift register unit of the first and the second sets of shift register units comprises a first N-type transistor, a second N-type transistor, and a third N-type transistor, and one shift register unit corresponds to pixels in one line;

except for shift register units of first lines in the first and the second sets of shift register units, a gate of the first N-type transistor in each of the rest shift register units is coupled to a voltage output end of a former level shift register unit of the corresponding set, and a first end of the first N-type transistor receives a first input signal, and a second end of the first N-type transistor is coupled to a gate of the third N-type transistor of the corresponding set; wherein the voltage output end of the former level shift register unit of the corresponding set is employed to control on-off of the corresponding first N-type transistor, and to control on-off of the first input signal to the corresponding third N-type transistor;

except for shift register units of last lines in the first and the second set of shift register units, a gate of the second N-type transistor in each of the rest shift register units is coupled to a voltage output end of a latter level shift register unit of the corresponding set, and a first end of the second N-type transistor receives a second input signal, and a second end of the second N-type transistor is coupled to the gate of the third N-type transistor of the corresponding set; wherein the voltage output end of the latter level shift register unit of the corresponding set is employed to control on-off of the corresponding second N-type transistor, and to control on-off of the second input signal to the corresponding third N-type transistor;

a first end of the third N-type transistor in each rest shift register unit is coupled to a first clock signal or a second clock signal, and a second end of the third N-type transistor is employed as being a voltage output end of the corresponding shift register unit, and employed to be coupled to the pixels of the corresponding line for charging and discharging the pixels, and to provide a gate voltage;

wherein each shift register unit further comprises a fourth N-type transistor, and a gate of the fourth N-type transistor receives the first or second clock signal, and a first end of the fourth N-type transistor is coupled to the gate of the corresponding third N-type transistor, and a second end of the fourth N-type transistor is coupled to a second end of the corresponding third N-type transistor, wherein the gate of the fourth N-type transistor and the first end of the corresponding third N-type transistor receive the same clock signal.

10. The liquid crystal display according to claim 9, wherein each shift register unit further comprises a first capacitor, and the first capacitor is coupled between the gate of the corresponding third N-type transistor and the second end of the corresponding third N-type transistor.

11. The liquid crystal display according to claim 10, wherein each shift register unit further comprises a fifth N-type transistor, and a first end of the fifth N-type transistor is coupled to the second end of the corresponding third N-type transistor, and a second end of the fifth N-type transistor is coupled to a direct current low voltage source, and a gate of the fifth N-type transistor receives a pull-down control signal to be in an off state as the corresponding third N-type transistor is on.

12. The liquid crystal display according to claim 11, wherein each shift register unit further comprises a sixth N-type transistor, a seventh N-type transistor, an eighth N-type transistor and a second capacitor, and a gate of the sixth N-type transistor is coupled to a first end of the sixth N-type transistor, and the first end of the sixth N-type transistor receives the first clock signal or the second clock signal, and a second end of the sixth N-type transistor is coupled to a first end of the corresponding second capacitor and the gate of the corresponding fifth N-type transistor to output the pull-down control signal to the gate of the corresponding fifth N-type transistor, and a second end of the second capacitor is coupled to the second end of the corresponding fifth N-type transistor, and a gate of the seventh N-type transistor is coupled to the second end of the corresponding first, the corresponding second N-type transistors, and a first end of the seventh N-type transistor is coupled to the second end of the corresponding sixth N-type transistor, and a second end of the seventh N-type transistor the direct current low voltage source or a second or first clock signal, and a gate of the eighth N-type transistor is coupled to a gate receiving reset signal, and a first end of the eighth N-type transistor is coupled to the gate of the corresponding seventh N-type transistor, and a second end of the eighth N-type transistor is coupled to the second end of the corresponding fifth N-type transistor, wherein the first end of the third N-type transistor and the first end of the sixth N-type transistor receive different clock signals, and the first end of the sixth N-type transistor and the second end of the seventh N-type transistor receive the same clock signal.

13. The liquid crystal display according to claim 12, wherein each shift register unit further comprises a ninth N-type transistor, and a first end of the ninth N-type transistor is coupled to the gate of the corresponding third N-type transistor, and a second end of the ninth N-type transistor is coupled to the first end of the corresponding fourth N-type transistor, and a gate of the ninth N-type transistor is coupled to the second end of the corresponding sixth N-type transistor, employed to receive the pull-down control signal to control the corresponding fifth N-type transistor to be in an off state when the corresponding third N-type transistor is on.

14. The liquid crystal display according to claim 13, wherein the liquid crystal display further comprises a glass substrate, and the both the first set of shift register units and the second set of shift register units are located on the glass substrate.

15. The liquid crystal display according to claim 13, wherein each shift register unit further comprises a first capacitor, and the first capacitor is coupled between the gate of the corresponding third N-type transistor and the second end of the third N-type transistor.

* * * * *